(12) United States Patent
Zheng et al.

(10) Patent No.: US 8,146,220 B2
(45) Date of Patent: Apr. 3, 2012

(54) LOW-PROFILE TOOL-LESS BOARD EXTRACTION DEVICE AND METHOD OF USING THE SAME

(75) Inventors: An-Sheng Anson Zheng, Guangzhou (CN); Michael T. Milo, Menlo Park, CA (US); Brett C. Ong, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 994 days.

(21) Appl. No.: 12/120,373

(22) Filed: May 14, 2008

(65) Prior Publication Data

US 2009/0282666 A1    Nov. 19, 2009

(51) Int. Cl.
*D02J 1/22* (2006.01)

(52) U.S. Cl. ............... 29/242; 29/759; 16/405; 16/444; 361/727

(58) Field of Classification Search .................... 16/405, 16/419, 436, 444; 220/759; 361/727; 29/426.5, 29/242, 759, 830
See application file for complete search history.

(56) References Cited

U.S. PATENT DOCUMENTS

| 1,819,611 | A | * | 8/1931 | Martin ........................... 16/419 |
| 3,566,436 | A | * | 3/1971 | Marks et al. .................... 16/405 |
| 5,694,290 | A | * | 12/1997 | Chang ........................... 361/727 |
| 6,735,824 | B2 | * | 5/2004 | Tisol Jr. et al. ................. 16/444 |

* cited by examiner

*Primary Examiner* — Donghai D. Nguyen
(74) *Attorney, Agent, or Firm* — Osha • Liang LLP

(57) ABSTRACT

A board extraction device with integrated mounting includes a base portion configured to be disposed on an opening of a circuit board, a rivet extending from a surface of the base portion and configured to pass through the opening, a handle flexibly connected to the base portion, and a pin flexibly connected to the base portion. The rivet has a hole extending therethrough. The pin engages the hole so as to fix the base portion to the circuit board.

20 Claims, 8 Drawing Sheets

LOW-PROFILE TOOL-LESS BOARD EXTRACTION DEVICE AND METHOD OF USING THE SAME

BACKGROUND

FIG. 1 shows a perspective view of a typical handle device for extracting a printed circuit board (PCB). As shown in FIG. 1, the handle device 100 has a handle 101 and two posts 102. Each post 102 is disposed on a surface of the PCB 103 via a washer 104 around an end of the PCB 103. Each end of the handle 101 is rotatably connected to a top of the post 102 by a cylindrical pin 105. Specifically, the cylindrical pin 105 is inserted into both an opening of the post 102 and an opening of the handle 101 so that the handle 101 is rotatably supported by the posts 102. The handle 101 has a rubber ring 106 at the middle thereof so that the rubber ring 106 instead of the handle 101 contacts with the PCB 103 when the handle 101 rotates. Thus, the PCB 103 and the electric parts on the PCB 103 are not damaged by the handle 101 even when the handle rotates toward the PCB 103.

FIG. 2 shows the handle device shown in FIG. 1 from the bottom of the PCB. As shown in FIG. 2, the posts 102 are fixed on the surface of the PCB 103 from the bottom of the PCB 103 by screws 201 via washers 202. The PCB 103 may have a component 203 on a back surface thereof.

When installing the handle device 100, the screws 201 are fastened from the back surface of the PCB 103 by a screw driver (not shown). Also, the typical handle device 100 is constituted of a various parts, such as screws 201, washers 104 and 202, the handle 101, the rubber ring 106, and pins 105 as explained.

SUMMARY OF INVENTION

One or more embodiments of the present invention relate to a board extraction device with integrated mounting includes a base portion configured to be disposed on an opening of a circuit board, a rivet extending from a surface of the base portion and configured to pass through the opening, a handle flexibly connected to the base portion, and a pin flexibly connected to the base portion. The rivet has a hole extending therethrough. The pin engages the hole so as to fix the base portion to the circuit board.

One or more embodiments of the present invention relate to a board extraction device with integrated mounting includes a plurality of base portions configured to be disposed on a plurality of openings of a circuit board, a plurality of rivets each extending from a surface of each of the plurality of the base portions and configured to pass through each of the plurality of openings, a handle flexibly connected to at least one of the plurality of base portions; and a plurality of pins flexibly connected to the plurality of base portions. The plurality of rivets each has a hole extending therethrough. The plurality of pins each engages the hole so as to fix the plurality of base portions to the circuit board.

One or more embodiments of the present invention relate to a method for handling a circuit board includes connecting a flexible handle to a base portion, disposing a hole through a rivet extending from a surface of the base portion, flexibly connecting a pin to the base portion, passing the rivet through an opening in a circuit board, and engaging the pin into the hole so as to fix the base portion to the circuit board. The circuit board is capable of being handled using the flexible handle.

Other aspects and advantageous of the invention will be apparent from the following description and appended claims.

DETAILED DESCRIPTION

Figure 1:
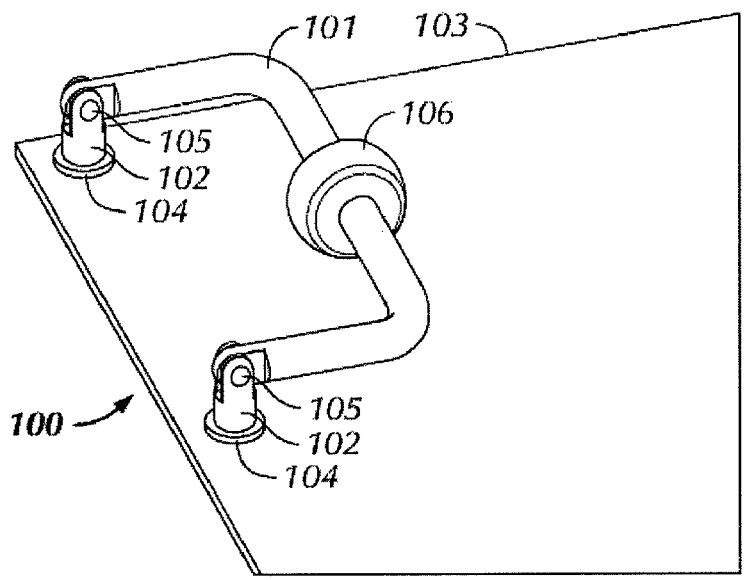
FIG. 1 shows a perspective view of a typical handle device for extracting a printed circuit board.
Figure 2:
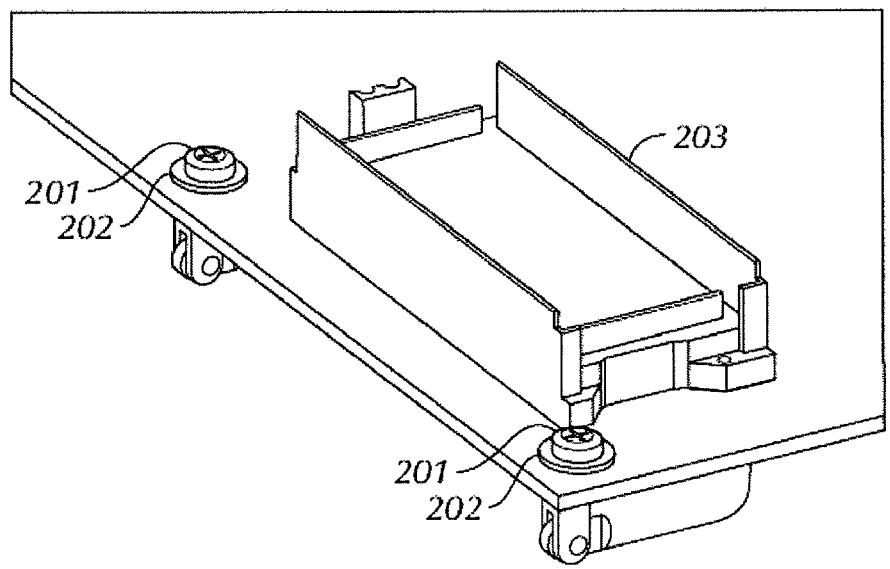
FIG. 2 shows the handle device shown in FIG. 1 from the bottom of the printed circuit board.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 3:
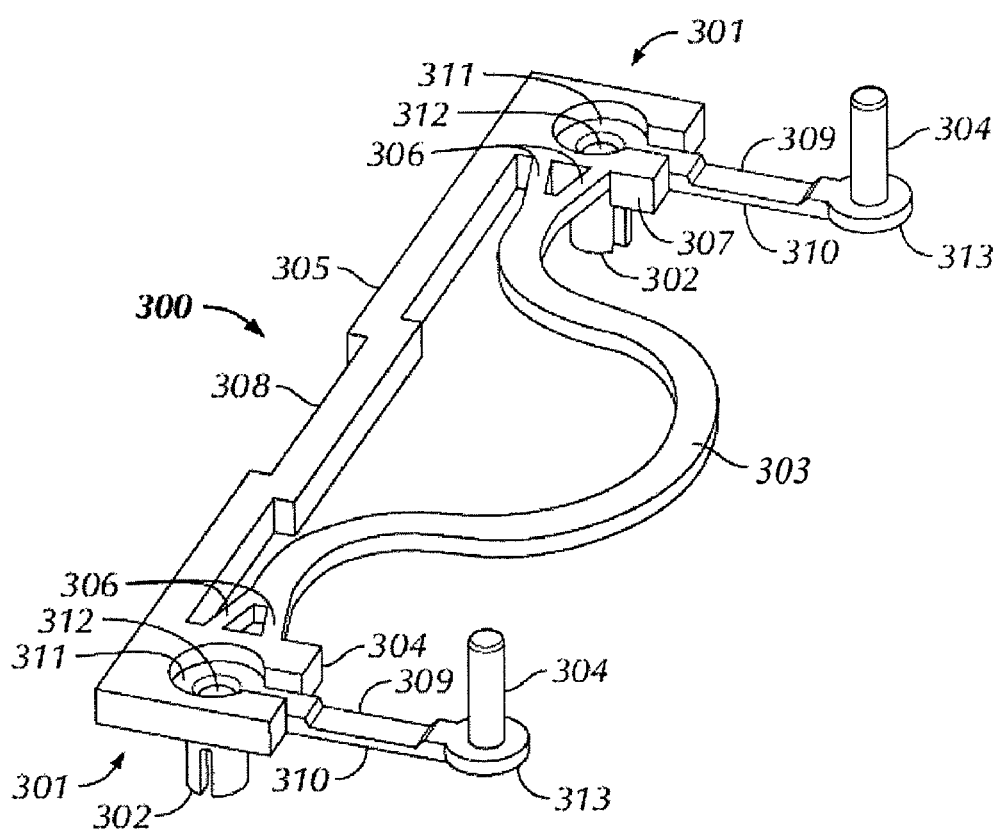
FIG. 3 shows a top perspective view of a board extraction device with integrated mounting.
Figure 4:
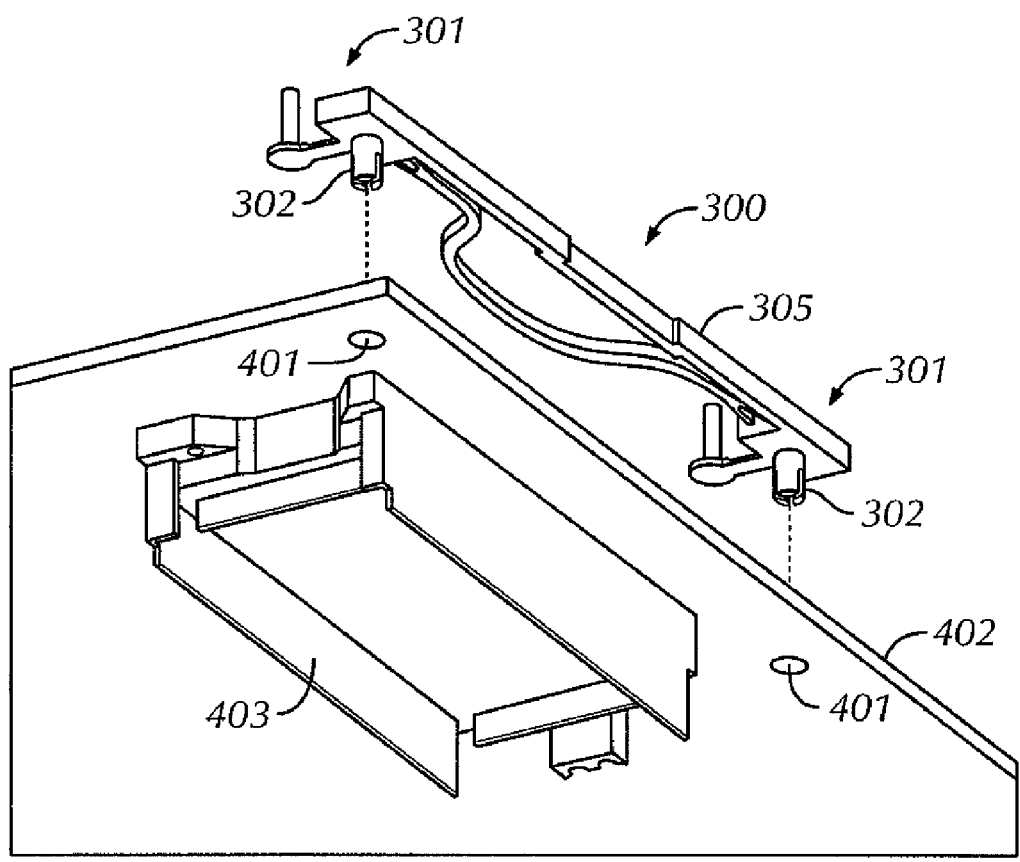
FIG. 4 shows a bottom perspective view of the board extraction device with integrated mounting.

FIG. 3 shows a top perspective view of a board extraction device with integrated mounting. FIG. 4 shows a bottom perspective view of the board extraction device with integrated mounting shown in FIG. 3. As shown in FIGS. 3 and 4, the board extraction device 300 has base portions 301, rivets 302, handle 303, pins 304, and a support 305. The board extraction device with integrated mounting 300 may be made by single material, such as polypropylene, plastic, or nylon. A circuit board 402 may have a component 403 on a surface thereof and may be an expansion card or any other printed circuit boards including various components for a computer and/or a server system (not shown).

As shown in FIGS. 3 and 4, the base portions 301 are connected by the handle 303. Specifically, each end of the handle 303 is connected to a side surface 307 of the base portion 301 via two connectors 306. The connectors 306 and/or the handle 303 are flexible such that the handle 303 is flexibly supported between the base portions 301 so that the handle 303 increases a handling gripping surface.

Although the handle 303 is curved in shape in FIGS. 3 and 4, the handle 303 may be any other shapes so long as the handle 303 provides a sufficient gripping surface for handling. Also, although each end of the handle 303 is connected to a side surface 307 of the base portion 301 via two connectors 306 in FIGS. 3 and 4, one skilled in the art will appreciate any other numbers, shapes, positions of connectors 306 and the handle 303 as long as the handle 303 is flexibly supported between the base portions 301 and the handle 303 provides an enough handling gripping surface.

The base portions 301 are connected by the support 305 at one end of the side surface 307 of the base portion 301. Although the support 305 shown in FIGS. 3 and 4 has a shifted portion 308 at the middle of the support 305, the support 305 may be straight in shape. In addition, the thickness of the base portion 301 may be the same as that of the support 305, and the base portion 301 may be integral with the support 305. In addition, in one or more embodiments of the present invention, the support 305 may be omitted.

The pin 304 is connected to a side surface 308 of the base portion 301 by a pin connector 309. The pin 304 has a head portion 313 at one end of the pin 304. The pin 304 is cylindrical in shape. The pin connector 309 has a thin portion 310 at the middle thereof so that the pin connector 309 is easily folded when the pin 304 engages a hole 312. Although the pin 304 is attached to the base portion 301 via the pin connector 309 in FIGS. 3 and 4, the pin 304 may be a separate from the base portion 301.

Figure 5:
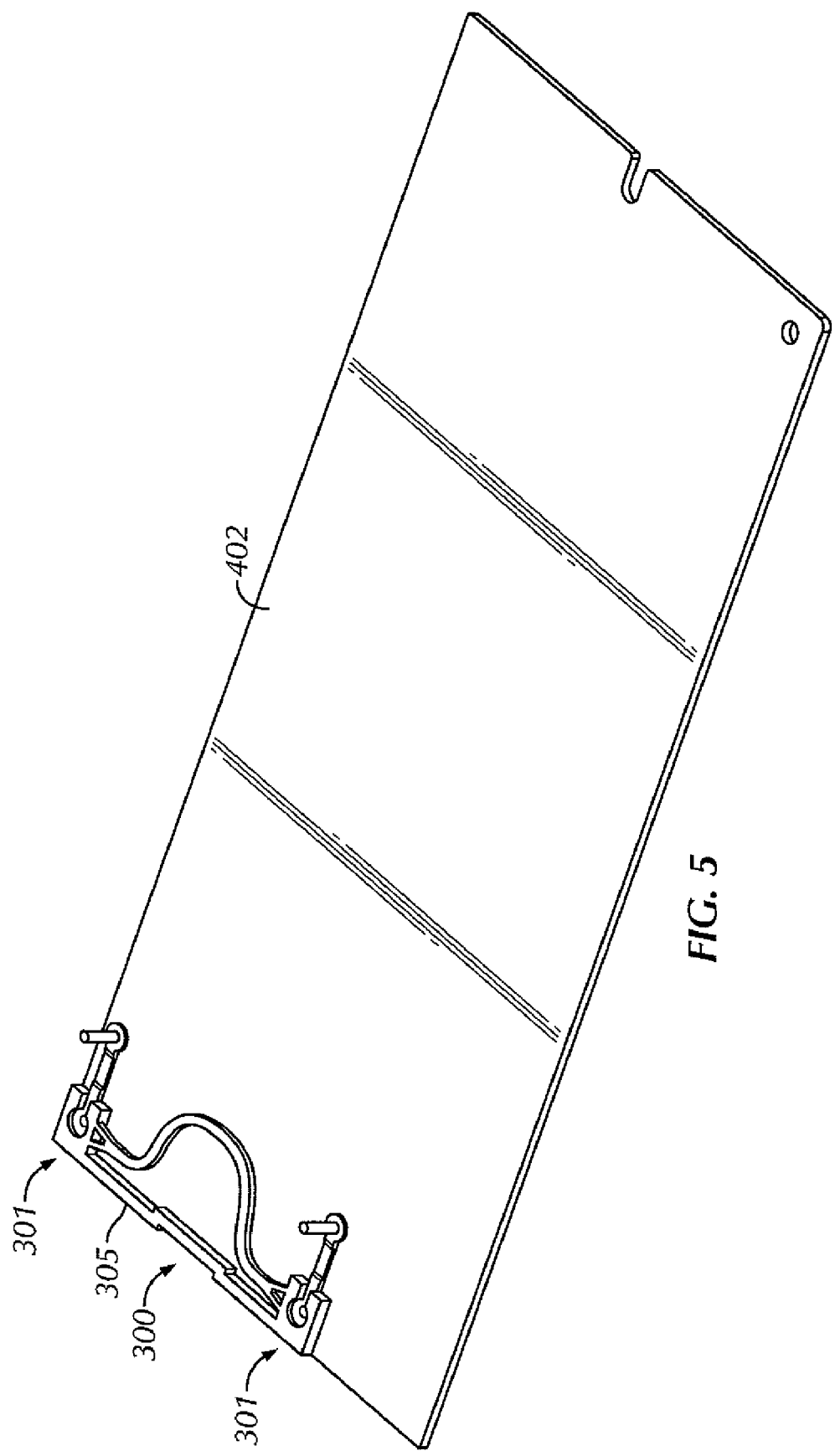
FIG. 5 shows a top perspective view of the board extraction device with integrated mounting installed on a circuit board.

FIG. 5 shows a top perspective view of the board extraction device with integrated mounting installed on a circuit board. The circuit board may be installed in a computer or a sever system (not shown). The circuit board 402 has an opening 401 as shown in FIG. 4. The rivet 302 is inserted into the opening 401 around one end of the circuit board 402 as shown in FIG. 5 so that the board extraction device with integrated mounting 300 is disposed on the circuit board 402. Specifically, one of the base portions 301 is disposed at one corner of the circuit board 402, and another base portion 301 is disposed around the end of the circuit board 402. That is, the support 305 is disposed along a corner end of the circuit board 402. One skilled in the art will appreciate any other positions of the openings 401 in accordance with a design of a computer to which the board extraction device with integrated mounting 300 is installed.

Figure 6:
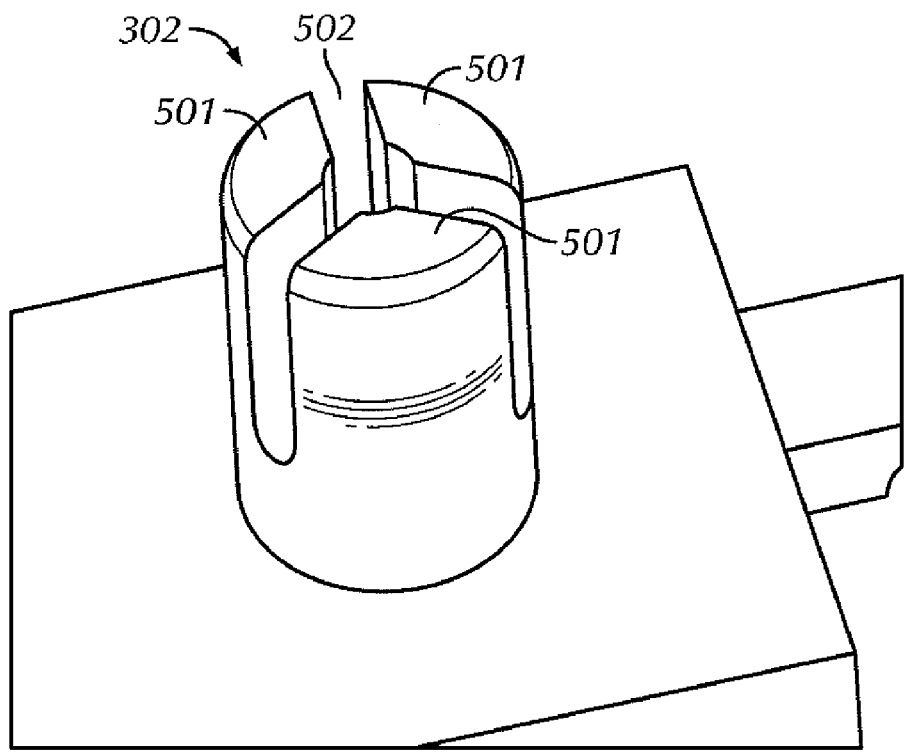
FIG. 6 shows an enlarged view of the rivet of the board extraction device with integrated mounting.
Figure 7:
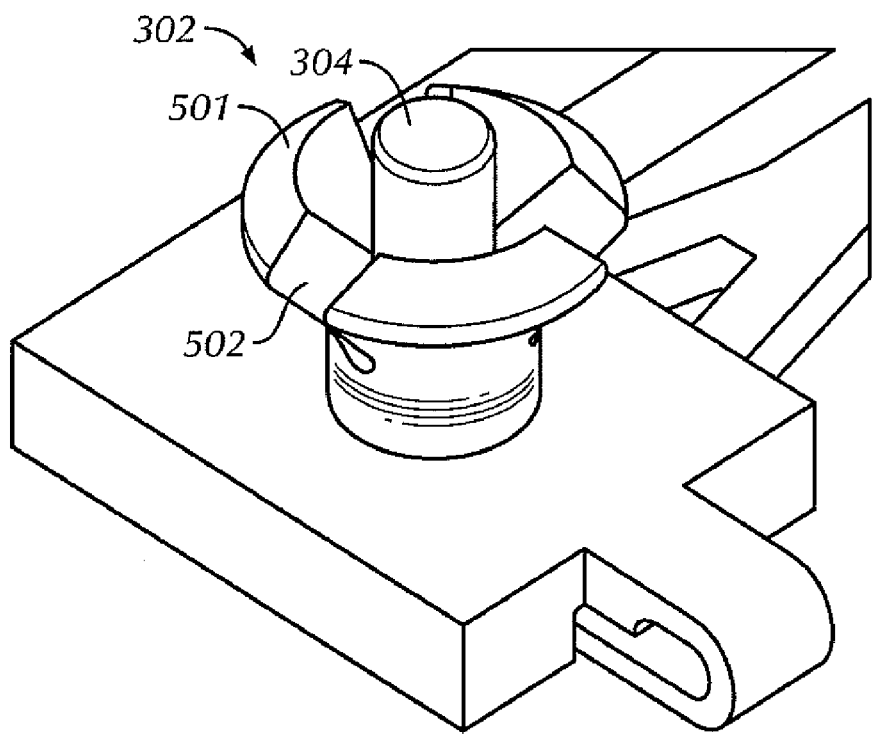
FIG. 7 shows an enlarged view of the rived when the pin is inserted into the hole of the base portion where the board extraction device with integrated mounting is not installed to a circuit board.
Figure 8:
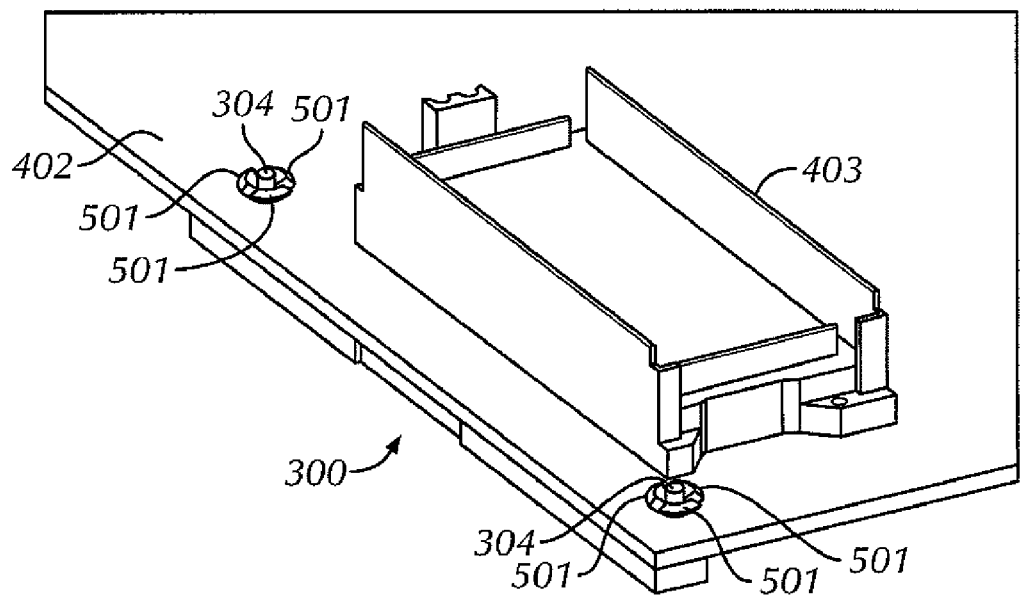
FIG. 8 shows a perspective view of the board extraction device with integrated mounting installed to a circuit board where the pin is inserted into the hole of the base portion.

FIG. 6 shows an enlarged view of the rivet of the board extraction device with integrated mounting. FIG. 7 shows an enlarged view of the rivet when the pin inserted into the hole of the base portion where the board extraction device with integrated mounting is not installed to a circuit board. FIG. 8 shows a perspective view of the board extraction device with integrated mounting installed to a circuit board when the pin is inserted into the hole of the base portion. As shown in FIG. 6, the rivet 302 has three slits 502 cut in three directions from the center of the rivet 302 so that the rivet 302 has three tip portions 501. The size of each tip portion 501 is the same. One skilled in the art will appreciate that any other numbers of tip portions 501 so long as the tip portions 501 tightly hold the circuit board 402 as explained below.

The hole 312 extends to the tip portions 501. However, the diameter of the hole 312 where the tip portions 501 exist is narrower than the diameter of the hole 312 where the tip portions 501 do not exist. Thus, when the pin 304 is inserted into the hole 312, the pin 304 pushes the inside surface of tip portions 501 so that the tip portions 501 are widen by the pin 304 as shown in FIG. 7. Also, at this time, as shown in FIG. 8, the board extraction device with integrated mounting 300 tightly holds the circuit board 402 between the outside surface of the tip portions 501 and the bottom surface of the base portions 301.

Figure 9:
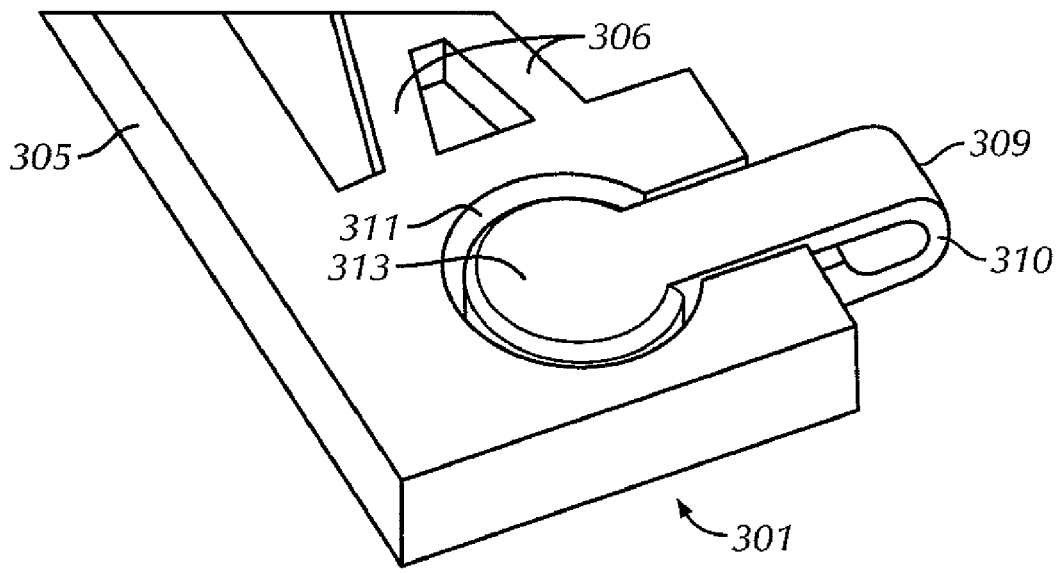
FIG. 9 shows an enlarged top perspective view of the board extraction device with integrated mounting where the pin is fully inserted in the hole.

FIG. 9 shows an enlarged top perspective view of the board extraction device with integrated mounting when the pin is fully inserted in the hole. As shown in FIGS. 3 and 9, the base portion 301 has a recess 311 and the hole 312. The size of the recess 311 is approximately the same as the head portion 313 of the pin 310 so that the head portion 313 is fully enclosed in the recess 311 of the base portion 301 when the pin 304 is fully inserted into the hole 312. At this time, the pin connector 309 is folded at the thin portion 310. Thus, when the board extraction device with integrated mounting 300 disposed on a circuit board is installed in a computer (not shown), the pin 304 and the pin connector 309 substantially do not impact an airflow impedance of a computer (not shown). In other words, the board extraction device with integrated mounting 300 minimizes the impact to an airflow impedance of a computer.

Figure 10:
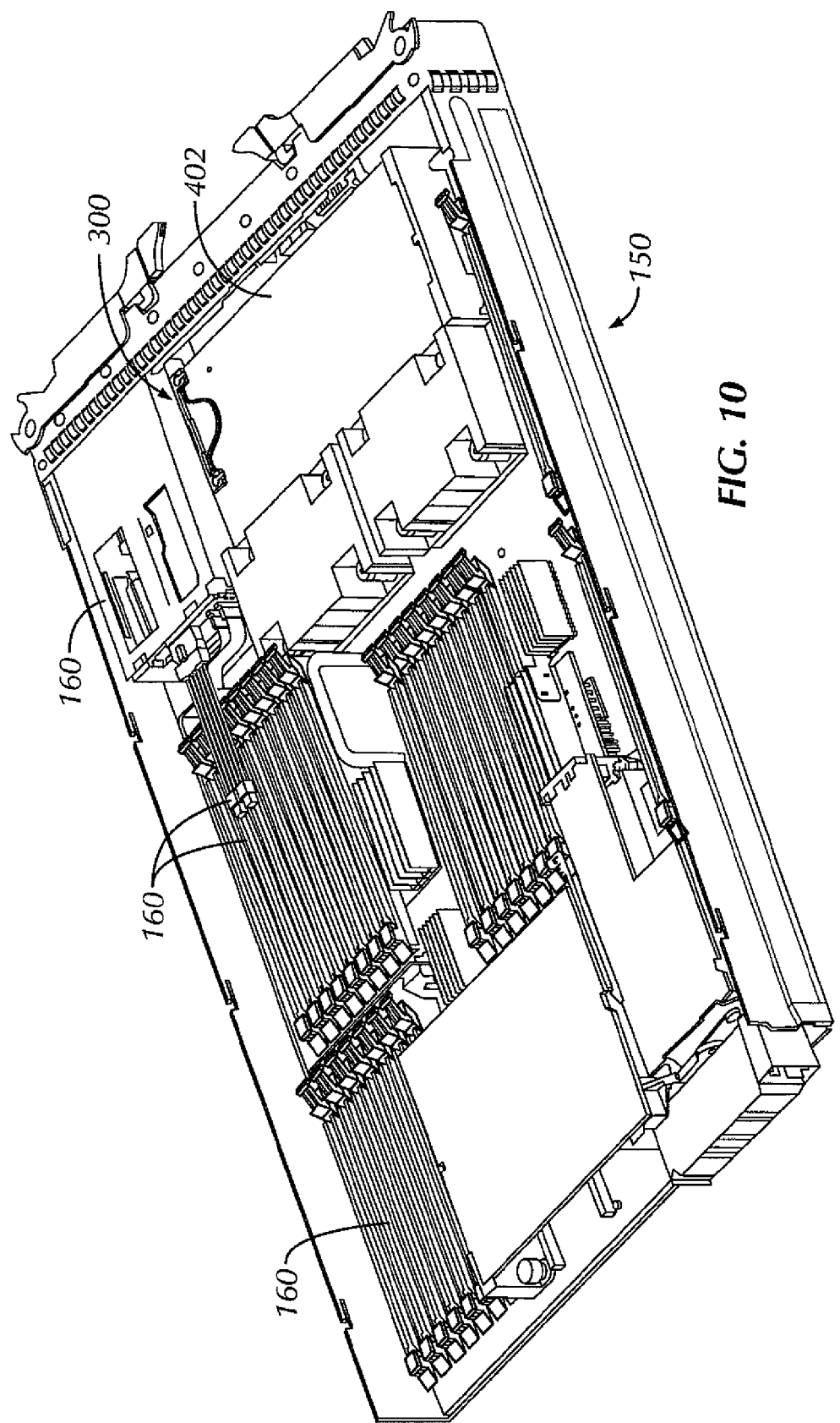
FIG. 10 shows the board extraction device with integrated mounting installed to a computer.

FIG. 10 shows the board extraction device with integrated mounting when installed to a computer. As shown in FIG. 10, in a computer 150, there are a various components 160. Because the board extraction device with integrated mounting 300 is installed on one end of the circuit 402 where the handle 303 are thin and along the circuit board 402 and the pins 304 is inserted into the holes 312, the board extraction device with integrated mounting 300 does not impact substantially a airflow impedance of the computer 150. Also, because the handle 303 stays flush against the circuit board, the handle 303 are prevented from flopping around in the computer 150 when the computer is subject to vibration from other parts such as a fan (not shown). Further, the board extraction device with integrated mounting 300 minimizes a foot print for providing a handle. Furthermore, the board extraction device with integrated mounting 300 can be placed even in areas of tight space constraint.

Figure 11:
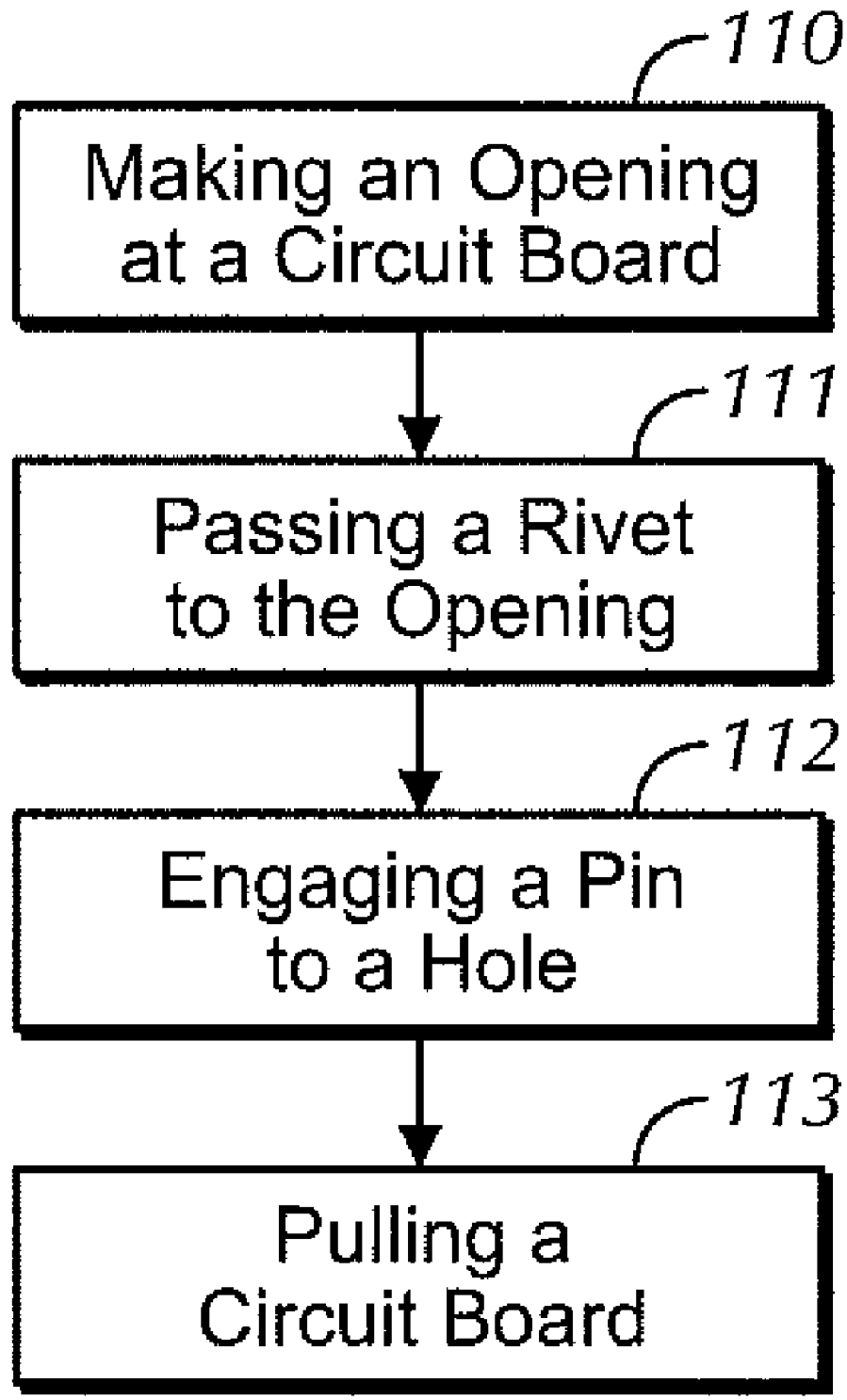
FIG. 11 shows a flow diagram of installing the board extraction device with integrated mounting to a circuit board.

FIG. 11 shows a flow diagram of installing the board extraction device with integrated mounting to a circuit board. In one or more embodiments of the invention, one or more steps described below may be omitted, repeated, and/or performed in a different manner.

First, openings 401 are made at one end of the circuit board 402 (Step 110). The position of the openings 401 may be adjusted according to the design of the computer to which the device 300 is installed. Second, the device 300 is installed on the circuit board 402 (Step 111). Specifically, the rivets 302 are inserted into the openings 401 of the circuit board 402.

Next, the pin 304 is inserted into the hole 312 of the base portion 301 (Step 112). At this time, as explained above, the pin connectors 309 are bent and folded. In addition, both pins 304 may be inserted into the holes 312 at the same time. Then, the pin 304 pushes the inside surface of the tip portion 501 so that the tip portion 501 is widened. At this time, the outside surfaces of the tip portions 501 are moved toward the surface of the circuit board 402. Then, the outside surfaces of the tip portions 501 contact with the bottom surface of the circuit board 402 so that the circuit board 402 is tightly held by the outside surfaces of the tip portions 501 and the bottom surface of the base portion 301. Also, at this time, the tip portions 501 tightly hold the pin 304 because tip portions 501 push the pin 304.

Finally, the handle 303 is rotated until the handle is able to be held to extract the circuit board 402 (Step 113). Then, the circuit board 402 may be extracted by using the handle 303. In addition, after extracting and releasing the circuit board 402, the circuit board 402 may be returned to a original position or other positions in a computer (not shown) using the handle 303. In addition, the board extraction device with integrated mounting 300 may be retained in the computer 150 as shown in FIG. 10.

Therefore, the board extraction device with integrated mounting 300 is attached top-down. In other words, unlike the typical handle device 101, the board extraction device with integrated mounting 300 eliminates a need to flip the circuit board 402 in the computer 150 to attach screws 201 from the bottom of the circuit board 402. In this sense, it may be minimize a possibility to damage a circuit board and/or a computer while installing a handle device to a circuit board in a computer.

In one or more embodiments of the present invention, one skilled in the art will appreciate that any other numbers of the base portions 301, pins 304, and rivets 302 in accordance with the design of the circuit board 402. For example, the board extraction device with integrated mounting 300 may have only one set of the base portion 301, the pin 304, and the rivet 302. The handle 303 may be flexibly supported by one base portion 301. On the other hand, in one or more embodiments, the board extraction device with integrated mounting 300 may have more than two sets of the base portion 301, the pin 304, and the rivet 302. The handle 303 may be flexibly supported by some or all of the base portions 301, and the base portion 301, the pin 304, and the rivet 302 may have plurality of handles 303 between the base portions 301. Further, the support 305 may be flexibly supported by some or all of the base portions 301.

One or more embodiments of the present invention may have one or more of the following advantages. It is not necessary to use any tools to install the board extraction device with integrated mounting 300 to a circuit board 402 in a computer 150. The board extraction device with integrated mounting 300 also has a low-profile and does not substantially impact to airflow impedance in the computer 150 at least because the board extraction device with integrated mounting 300 is thin and along the surface of the circuit board 402 when the board extraction device with integrated mounting 300 is in the computer 150. As a result, the board extraction device with integrated mounting 300 may enhance system performances and allow flexibility of the position of the board extraction device with integrated mounting 300. Also, it may result in better handling of the circuit board 402. Further, the board extraction device with integrated mounting 300 enables the position thereof, which is very close to computer system covers (not shown).

What is claimed is:

1. A board extraction device with integrated mounting, comprising:
    a base portion configured to be disposed on an opening of a circuit board;
    a rivet extending from a surface of the base portion and configured to pass through the opening, wherein the rivet has a hole extending therethrough;
    a handle flexibly connected to the base portion; and
    a pin flexibly connected to the base portion, wherein the pin configured to be inserted into the hole for widening the rivet so as to fix the base portion to the circuit board.

2. The board extraction device with integrated mounting of claim 1, wherein the base portion has a recessed portion, and wherein the pin has a head portion at an end thereof such that the head portion is inserted in the recessed portion.

3. The board extraction device with integrated mounting of claim 1, wherein the pin has at least a tip portion configured to be widen when the pin engages the hole.

4. The board extraction device with integrated mounting of claim 1, wherein a diameter of the hole widens toward the base portion.

5. The board extraction device with integrated mounting of claim 1, wherein the base portion is disposed at an end of the circuit board.

6. The board extraction device with integrated mounting of claim 1, wherein the board extraction device with integrated mounting is made by at least one of polypropylene, plastic, and nylon.

7. A board extraction device with integrated mounting, comprising:
    a plurality of base portions configured to be disposed on a plurality of openings of a circuit board;
    a plurality of rivets each extending from a surface of each of the plurality of the base portions and configured to pass through each of the plurality of openings, wherein the plurality of rivets each has a hole extending therethrough;
    a handle flexibly connected to at least one of the plurality of base portions; and
    a plurality of pins flexibly connected to the plurality of base portions, wherein the plurality of pins each configured to be inserted into the hole of the plurality of rivets for widening the rivets so as to fix the plurality of base portions to the circuit board.

8. The board extraction device with integrated mounting of claim 7, further comprising a support connecting at least two of the plurality of base portions.

9. The board extraction device with integrated mounting of claim 8, wherein the support has a shifted portion at a middle thereof.

10. The board extraction device with integrated mounting of claim 7, further comprising a plurality of supports connecting the plurality of base portions.

11. The board extraction device with integrated mounting of claim 7, wherein the handle is connected to two of the plurality of base portions.

12. The board extraction device with integrated mounting of claim 7, further comprising a plurality of handles connected each pair of the plurality of the base portions.

13. The board extraction device with integrated mounting of claim 7, wherein each of the plurality of the base portions has a recessed portion, and wherein the plurality of the pins each has a head portion such that the head portion is inserted in the recessed portion.

14. The board extraction device with integrated mounting of claim 7, wherein the plurality of the pins each has at least a tip portion configured to be widen when the plurality of pins each engages the hole.

15. The board extraction device with integrated mounting of claim 7, wherein a diameter of the plurality of halls widen toward the plurality of base portions.

16. The board extraction device with integrated mounting of claim 7, wherein the board extraction device with integrated mounting is made by at least one of polypropylene, plastic, and nylon.

17. The board extraction device with integrated mounting of claim 7, wherein the handle is curved at a middle thereof.

18. The board extraction device with integrated mounting of claim 7, wherein the handle is connected to the plurality of shifted portion by two connectors.

19. The board extraction device with integrated mounting of claim 7, wherein the plurality of the rivets has at least three tip portions.

20. A method for handling a circuit board, comprising:
    connecting a flexible handle to a base portion;

disposing a hole through a rivet extending from a surface of the base portion;

flexibly connecting a pin to the base portion; passing the rivet through an opening in a circuit board, and engaging the pin into the hole so as to fix the base portion to the circuit board; and wherein the circuit board is capable of being handled using the flexible handle.

* * * * *